United States Patent [19]

Gross et al.

[11] Patent Number: 5,123,732
[45] Date of Patent: Jun. 23, 1992

[54] OPTICAL TIME DOMAIN REFLECTOMETER AND CURRENT VOLTAGE CONVERTER FOR USE THEREIN

[75] Inventors: Siegfried Gross, Neuhengstett; Michael Fleischer-Reumann, Gechingen, both of Fed. Rep. of Germany

[73] Assignee: Hewlett-Packard Company, Palo Alto, Calif.

[21] Appl. No.: 623,598

[22] Filed: Dec. 7, 1990

[30] Foreign Application Priority Data

Dec. 18, 1989 [EP] European Pat. Off. ............ 89123358

[51] Int. Cl.$^5$ .................... G01N 21/88; H03K 3/42
[52] U.S. Cl. .................... 356/73.1; 307/311; 307/565
[58] Field of Search ................ 356/73.1; 307/565, 566

[56] References Cited

U.S. PATENT DOCUMENTS

| | | | |
|---|---|---|---|
| 3,440,557 | 4/1969 | Sundeen, Jr. ................ | 307/565 X |
| 3,968,361 | 7/1976 | Bumgardner .................. | 250/214 |
| 4,218,613 | 8/1980 | Bletz ............................. | 307/311 X |
| 4,578,576 | 3/1986 | Wheeler et al. ............... | 250/214 |
| 4,960,989 | 10/1990 | Liebenrood et al. .......... | 356/73.1 X |
| 5,023,951 | 6/1991 | Kahn ............................. | 330/59 |

FOREIGN PATENT DOCUMENTS

| | | |
|---|---|---|
| 0185199 | 6/1986 | European Pat. Off. . |
| 3543677 | 6/1987 | Fed. Rep. of Germany . |
| 2194406 | 3/1988 | United Kingdom . |

Primary Examiner—Vincent P. McGraw

[57] ABSTRACT

The invention provides a current-voltage converter comprising: an input port, amplifying means comprising an inverting amplifier (U1) having an inverting input terminal and an output terminal, the output terminal being coupled to the input port of the current-voltage converter via a resistor (RF). The invention is characterized in that a voltage clipping means is connected between the input port of the current-voltage converter and a fixed potential, that the inverting amplifier (U1) has a gain such that the maximum of the output voltage (U0) of a specific polarity of the inverting amplifier (U1) is the product of the gain of the current-voltage converter and the corresponding maximum voltage across the clipping means. Thus, saturation of the inverting amplifier can be avoided.

15 Claims, 6 Drawing Sheets

OPTICAL TIME DOMAIN REFLECTOMETER AND CURRENT VOLTAGE CONVERTER FOR USE THEREIN

FIELD OF THE INVENTION

The present invention relates to the field of optical time domain reflectometers (OTDRs). More particularly, the invention relates to current-voltage converters of the type used in OTDRs.

BACKGROUND OF THE INVENTION

OTDRs are used, for example, for testing glass fibers. The OTDR includes an optical receiver having an avalanche photodiode or a PIN diode as a receiving element, and a transimpedance amplifier which converts the photocurrent delivered by the receiving diode into a voltage. The principle of such a circuit is described in Hewlett-Packard Journal, December 1988, pages 26 to 28.

A significant problem with such circuits is the circuit's behavior on overloading by large optical pulses. Assuming a conversion factor between optical input power and output voltage of 1000 V/mW, which is usual for transimpedance amplifiers in the measurement technology, and further assuming a supply voltage of 12 V, saturation of the amplifier is reached at an optical power of as low as $12\mu W$.

Upon overloading, such transimpedance amplifiers have very long relaxation times, typically up to $10\mu s$, until the operating point is exactly readjusted. This behavior is particularly disadvantageous when measuring optical backscatter since very low signal levels (about 1nW) have to be measured, while at the same time it is possible that very large optical pulses (up to 1 mW) occur resulting from reflections at plugs.

It would be beneficial to provide an OTDR in which, after receiving a large reflected pulse, the time for reaching a value of about 0.01% deviation from the operating point be no greater than 30 ns. Moreover, it would be useful to provide a transimpedance amplifier, or more generally a current-voltage converter, with improved behavior on overloading, without changing the bandwidth and other essential parameters of the amplifier. Neither of these objectives is achieved by known transimpedance amplifiers.

Accordingly, it is an object of the present invention to provide a current-voltage converter of the type useful in optical time domain reflectometry which is minimally influenced by large input pulses. A further object of the invention is to provide such an amplifier which in addition has a bandwidth comparable to that of presently existing amplifiers of the same type. The present invention achieves these goals.

SUMMARY OF THE INVENTION

The present invention provides a current-voltage converter comprising amplifying means, coupled between input and output ports of the converter, for converting an input voltage UI appearing at the input port into an output voltage UO. The amplifying means includes an inverting amplifier having an output terminal coupled to the output port, and a feedback resistor coupled between the output port and the input port. In addition, the current-voltage converter further includes a voltage clipper coupled to the input port, for limiting the maximum value of input voltage UI appearing at the input port. The maximum output voltage UO is therefore the product of the gain of the amplifying means and the maximum input voltage $UI_{max}$, as limited by the Voltage clipping means.

In a preferred embodiment, the current-voltage converter recited above further includes a photodiode, coupled between the input port and a fixed voltage point, for providing a current $(I_i)$ at the input port in response to an optical signal. In addition, in the preferred embodiment the amplifying means includes a noninverting amplifier coupled between the input port and an input terminal of the inverting amplifier. In another embodiment of the invention, the current-voltage converter further includes a second noninverting amplifier having an input terminal coupled to the output terminal of the first noninverting amplifier and an output terminal coupled to the voltage clipping means, and means for setting the gains of the first and second noninverting amplifiers such that the product of their gains is approximately +1. Most preferably, the gain of each of the first and second noninverting amplifiers is set to approximately +1.

In an alternative embodiment, the present invention provides an optical time domain reflectometer (OTDR) for testing an optical fiber or waveguide. According to the invention, as OTDR embodying the invention comprises an optical signal source for providing optical test signals to the fiber or guide being tested, and an optical receiver for receiving the test signal after transmission of the test signal through the fiber or guide. The optical receiver comprises a current-voltage converter in accordance with the invention, as described above. In addition, the OTDR comprises means for coupling the optical signal provided by the source to the optical fiber or waveguide, and for coupling signals reflected by the optical fiber or waveguide to the receiver.

Further features and advantages of the invention will become apparent from the following description of specimen embodiments of the invention with reference to the drawings showing essential details of the invention, and from the claims. The individual features may be realized individually or in any desired combination in an embodiment of the invention.

DETAILED DESCRIPTION OF THE PREFERRED EMBODIMENTS

The preferred embodiments of the invention are described with reference to the drawings, wherein like reference characters represent like elements. Although the invention is discussed with reference to transimpedance amplifiers for OTDRs, it is noted that the invention is also useful for other kinds of current-voltage converters. In addition, the invention is useful for high, low and D.C. input signals.

In the drawings, clipping or limitation of the input voltage UI is shown only for one polarity. It is noted that it is possible to provide clipping for two polarities by providing clipping means which also clip the other polarity. This can be realized easily by, e.g., the use of Schottky diodes, since Schottky diodes are used in the flow direction and are blocked in the reverse direction. This is in contrast to, e.g., Z-diodes, which are used in the reverse direction. In addition, the below-mentioned amplifiers, U1, U2, and U3 should be able to function for the two polarities of input signals.

Figure 1:
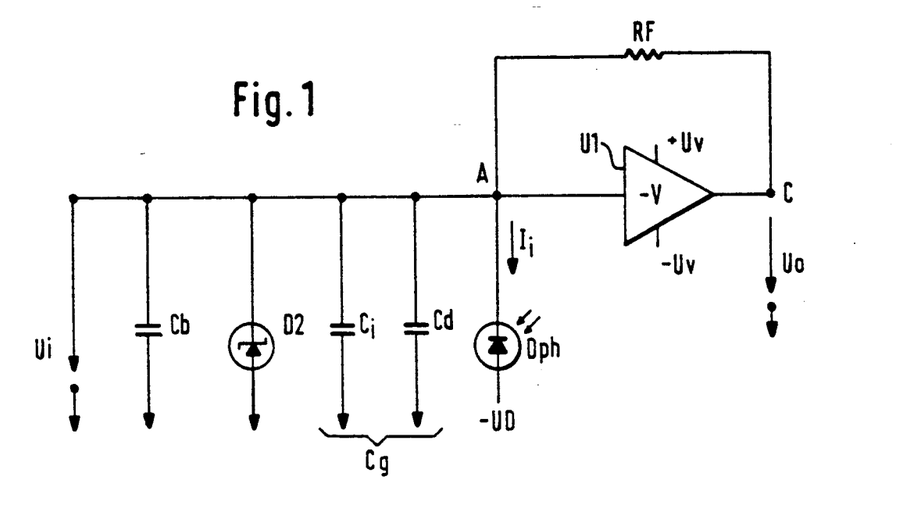
FIG. 1 is a schematic diagram representing a first example of a transimpedance amplifier according to the invention.
Figure 2:
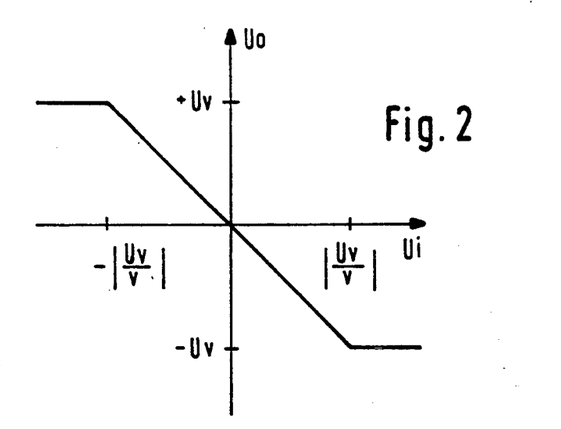
FIG. 2 depicts the ideal input-output characteristic of an amplifier circuit of the state of the art.

The transimpedance amplifier depicted in FIG. 1 differs from known transimpedance amplifiers in that it comprises a voltage clipping means, provided by diode D2 having a parasitic capacitance represented by capacitor Cb, and in that the absolute value of the gain of the amplifier of FIG. 1 is much smaller than that of most known amplifiers. In the known transimpedance amplifiers the inverting amplifier corresponding to amplifier U1 has a large voltage gain of $-V$. The inverting amplifier U1 is supplied with supply voltages of $+UV$ and $-UV$. Between the output terminal C and input terminal A, a resistor RF providing negative feedback is inserted. A current $I_i$ to be converted into an output voltage UO is provided by a photodiode DPH, the cathode of which is coupled to the terminal A and the anode of which is coupled to a negative supply voltage $-UD$. The input capacitance of the inverting amplifier U1 is symbolized by a capacitor Ci, and the capacitance of photodiode DPH is symbolized by a capacitor CD. The sum of Ci and CD is the value CG.

As is known, the transfer function of the circuit of FIG. 1 is $$\frac{UO}{I_i} = \frac{V}{V+1} \times RF \times \frac{1}{1+s\tau}$$

where $$\tau = \frac{RF \times CG}{V+1}$$

and s is the complex angular frequency.

The photodiode DPH behaves approximately as a current source, the current of which depends on the received light. If the inverting amplifier U1 is saturated by a large input current from the photodiode DPH, the capacitance CG will discharge with a time constant $$\tau^1 - RFxCG$$

Only after discharge of the capacitance CG will the amplifier work linearly. It is noted that, prior to the present invention, all known inverting amplifiers had a long relaxation time once becoming saturated, which was due to the resulting thermal imbalance. These facts make it necessary that saturation of the amplifier be avoided.

According to the invention, in the transimpedance amplifier of FIG. 1, this is achieved by the diode D2 and by setting the absolute value of the gain V in concurrence with the following equation:

$$|-V| = \frac{UO_{max}}{U_c}$$

$UO_{max}$ is that maximum output voltage at which the inverting amplifier U1 is not yet saturated. This maximum output voltage depends on the supply voltages $+UV$ and $-UV$, its absolute value being necessarily smaller than the mentioned supply voltages. $U_c$ is the threshold or barrier voltage of diode D2.

In the circuit of FIG. 1, because of the relatively low gain of the inverting amplifier U1, the input voltage UI is not held near zero as in known amplifiers, but can reach the barrier voltage or threshold voltage of the diode D2, which may be 0.4. Therefore, diode D2 functions as a clipping means for the current-voltage converter. The circuit of FIG. 1 functions well for low frequencies, since at low frequencies capacitor CB does not contribute markedly to a reduction of the bandwidth of the current-voltage converter.

Figure 3:
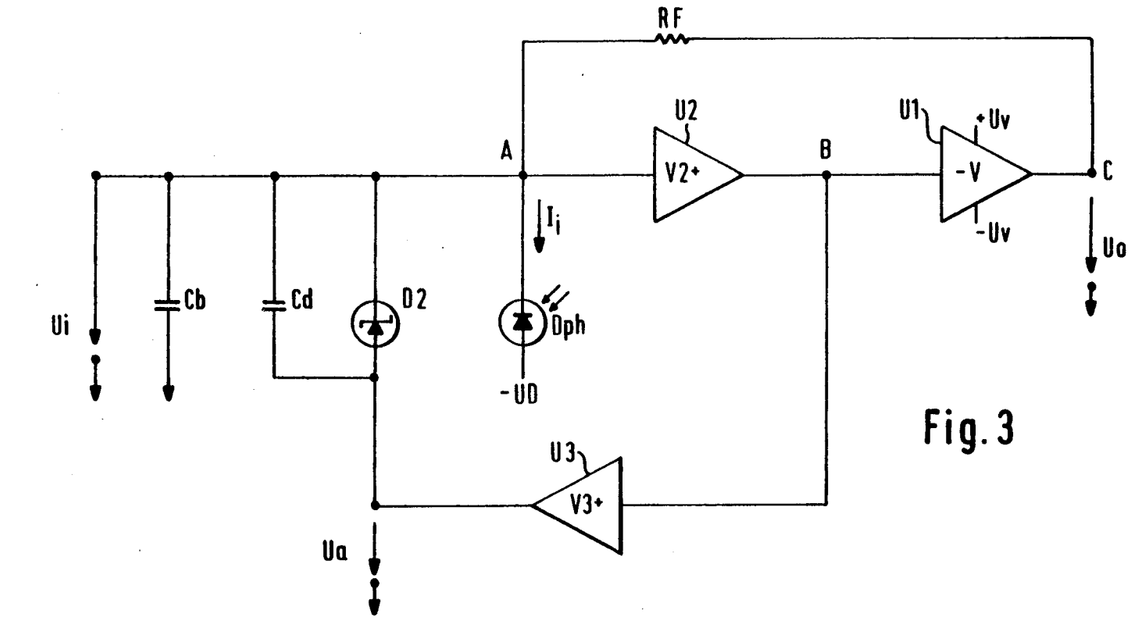
FIG. 3 is a schematic diagram representing a second example of a transimpedance amplifier according to the invention.

In the embodiment shown in FIG. 3, the lower end of diode D2 is not connected to ground as in FIG. 1. Rather, between the connecting point of photodiode DPH and diode D2 (i.e., terminal A) and the inverting terminal of amplifier U1, a second amplifier U2 with a positive gain V2+ is connected. (Thus, the inverting amplifier U1 of FIG. 1 is replaced by the combination U2, U1.) The output terminal of amplifier U2 is coupled to the input terminal of a third amplifier U3 having a positive gain V3+. The output terminal of amplifier U3 is coupled to the lower end of the diode D2, at the point D in FIG. 3.

The gains of amplifiers U2 and U3, respectively, are set such that their product (V2+ $\times$ V3+) is approximately +1, but not greater than +1, in order to avoid instabilities. Preferably, the gains of each of amplifiers U2 and U3 will be +1. Thus, the voltage at terminal A will be approximately the same as the voltage at the point D; in which case there will be no voltage across the diode D2 and its associated capacitor CB, and therefore no current through capacitor CB. This will be valid as long as the voltage UA at the point D follows exactly the voltage UI at the terminal A. The third amplifier U3 is provided with a limitation of its output voltage without saturation.

Figure 4:
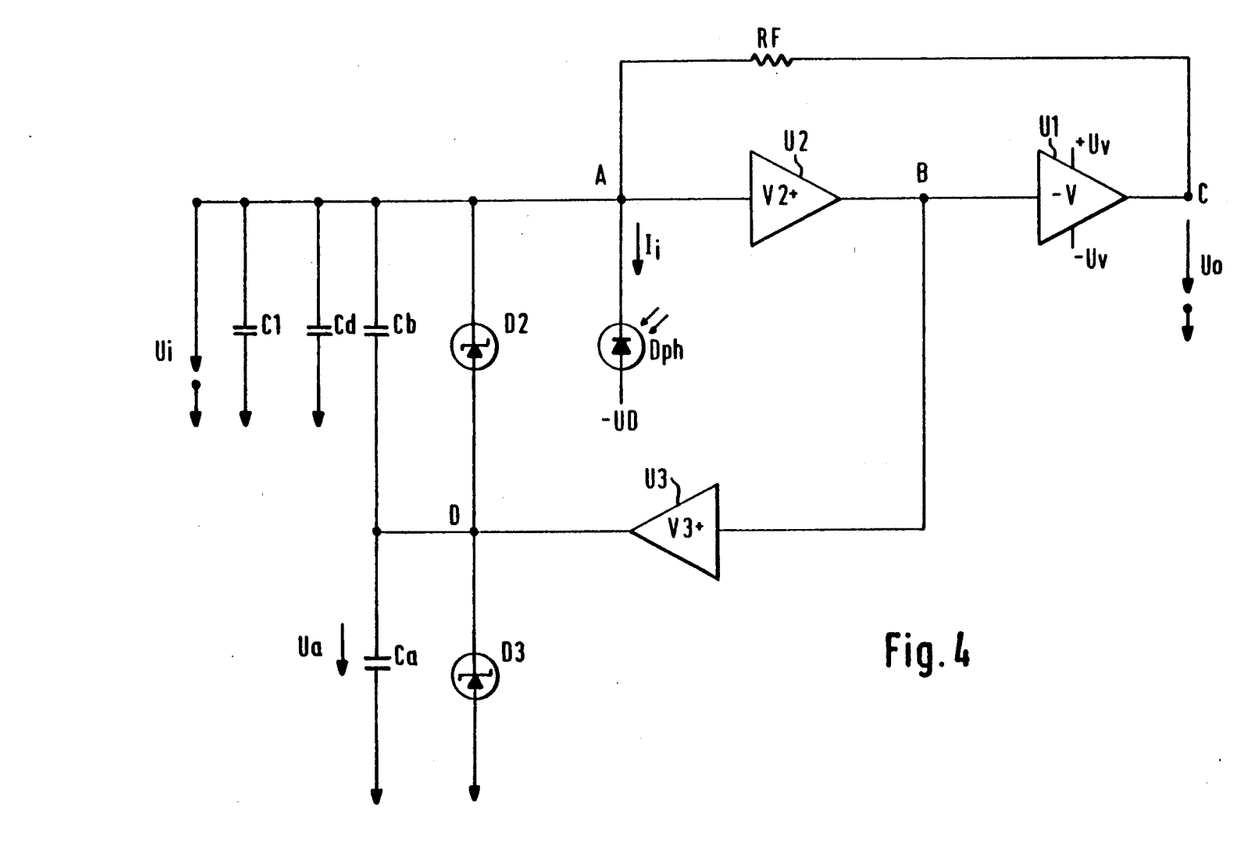
FIG. 4 is a schematic diagram representing a third example of a transimpedance amplifier according to the invention.

Referring now to the example shown in FIG. 4, this limitation (i.e., of the output voltage of amplifier U3) is realized by a diode D3 connected between the output terminal of amplifier U3 and ground. Diode D3 has a parasitic capacitance corresponding to the capacitor CA.

As long as the voltage UI at the input terminal A of the current-voltage converter, and therefore the voltage UA at the point D, is smaller than the threshold provided by the third amplifier U3 (FIG. 3) or the diode D3 (FIG. 4), the voltage UA will vary in accordance with the voltage UI. Thus, for small input signals (i.e., small currents $I_i$) and thus small voltages UI, the bandwidth will be relatively high, since the capacitance CB of diode D2 will not have any effect on the bandwidth.

In the circuit of FIG. 4, as the current $I_i$ increases, and therefore the voltage UI at terminal A becomes more negative, the voltage UA at terminal A remains approximately constant, since the diode D3 is chosen such that it provides an approximately constant voltage across itself when current flows through it. Now with the just mentioned increased signal $I_i$ at terminal A, a voltage different from zero lies across diode D2 and its associated capacitance CB. Therefore, the capacitance CB reduces the bandwidth of the current-voltage converter.

As the current $I_i$ and voltage UI become greater, the threshold of diode D2 is eventually reached, with the result that a further increase of current $I_i$ will not produce a further increase of voltage UI; in which case the output voltage UO will not increase. At this moment the overall current-voltage converter will have a dynamic gain of zero. Nevertheless, none of the amplifiers U1, U2, or U3 will be saturated. In addition, as soon as the current $I_i$ decreases to a point such that the threshold of diode D2 is no longer exceeded, the current-voltage converter will immediately perform normally again.

The above-described operation of the circuit of FIG. 4 makes it necessary to adjust the gain of the inverting amplifier U1 and the dependence of the voltage UI on the current $I_i$ such that diodes D2 and D3 are fully conductive before amplifier U1 begins to saturate. Assuming that diodes D2 and D3 are identical, this can be expressed by the following equation:

$$-v < \frac{UO_{max}}{2 U_c}$$

Figure 5:
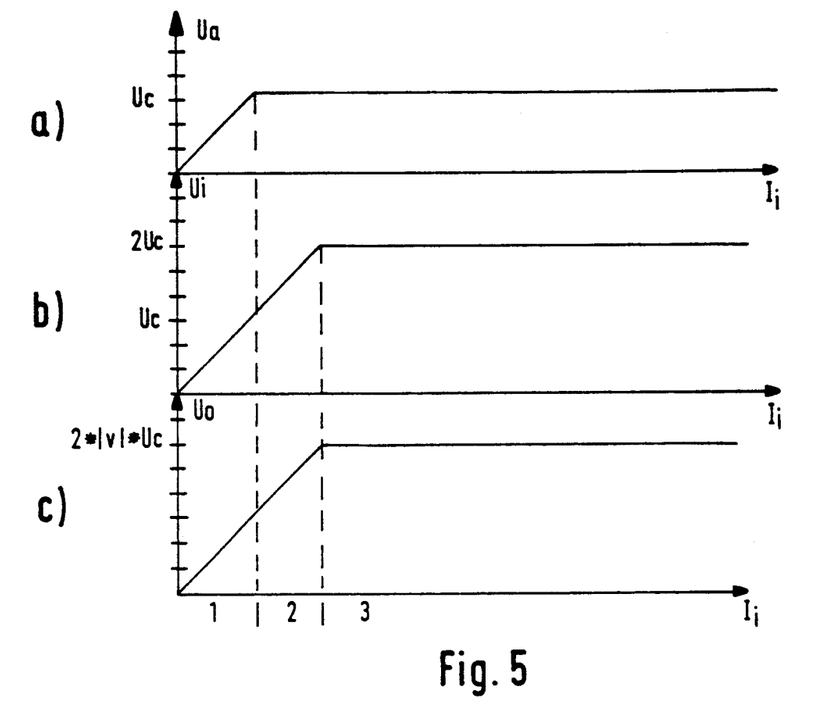
FIG. 5 shows the behavior of the circuit of FIG. 4.

FIGS. 5a to 5c show the dependencies of UA, UI and UO on $I_i$, respectively. There are three different zones:
   Zone 1: Linear function at high bandwidth,
   Zone 2: Area of transition into limitation (with reduced bandwidth), and
   Zone 3: Zone of limitation (amplifiers U1, U2, U3 working linearly).

Figure 6:
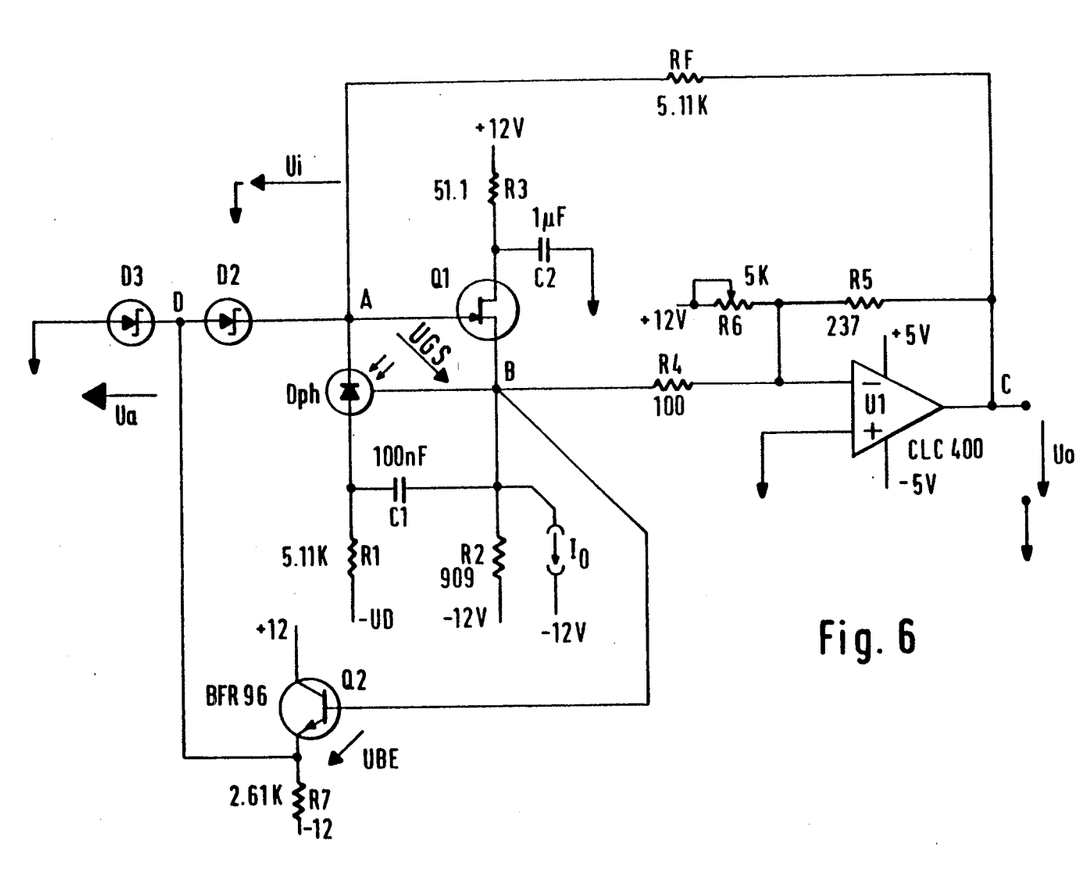
FIG. 6 is a schematic diagram representing one realized circuit according to the principle of FIG. 5.

FIG. 6 depicts a realized circuit. The inverting amplifier U1 is realized by an integrated circuit CLC400. The non-inverting input of amplifier U1 is connected to ground. Amplifier U2 of FIG. 4 is realized by a field effect transistor (FET) Q1, the gate terminal of which is connected to the point A, the source terminal of which is connected to a point B and the drain terminal of which is coupled via a 51.1 ohm resistor R3 to a positive 12 V supply voltage. The point B is coupled via a 100 ohm resistor R4 to the inverting input of amplifier U1.

FET Q1 in the embodiment is a GaAs field effect transistor for small signals, having very small capacitances between gate and drain on the one side and gate and source on the other side (Cgs=0.2 pF; Cgd=0.08 pF). In addition, this transistor has a very large impedance at its gate, which is necessary when very small signals I: have to be processed.

The inverting input of amplifier U1 is connected via a 237 ohm resistor R5 to the output terminal C, and via an adjustable 5K resistor R6, to a positive 12V supply voltage. This makes it possible to compensate the D.C. offset between gate and source of Q1, such that for an input voltage UI of 0 V the output voltage UO will be 0 V.

The amplifier U3 of FIG. 3 is realized in the circuit of FIG. 6 by an emitter follower comprising an NPN transistor Q2, the emitter of which is connected via a 2.61 K resistor R7 to a negative 12 V supply voltage and the collector of which is connected to a positive 12 V supply voltage. The emitter is connected to the point D between diodes D2 and D3. This circuit is very simple and automatically provides for current limitation, which is necessary in order to avoid the destruction of diode D3 and/or amplifier U3. When the base potential of transistor Q2 is lowered because of the occurrence of an optical signal at the photodiode DPH, the emitter voltage follows the base potential as long as diode D3 is not conductive. When the emitter potential is so low that at diode D3 the threshold voltage $U_c$ occurs, diode D3 becomes conductive and prevents further lowering of the Q2 emitter potential. When, due to an increase of current $I_i$ through photodiode DPH the base potential of transistor Q2 is driven more negative, the base-emitter voltage of Q2 is reduced, and thus the current through transistor Q2 is also reduced. In this case the current through diode D3 increases, however the increase is limited by resistor R7. A further advantage of this circuit is that transistor Q2 is never switched off completely, since the emitter voltage of Q2 never reaches a potential lower than $-U_c$, and since the voltage UI never becomes more negative than $-2U_c$.

If, as preferred, diodes D2 and D3 are Schottky diodes having $U_c = 0.4$ V, then the minimum base-emitter potential UBE of Q2 will be 0.4 V. Thus, transistor Q2 will not be shut off completely. If Q2 were to be switched off completely, this fact would have a negative influence on the dynamic behavior of the circuit.

The D.C. voltage offset UGSO between the gate and the source of FET Q1 is adjusted by means of an adjustable constant current circuit (a so-called current source) $I_Q$ such that the following equation holds true:

|UGSO| = UBEO

With this setting, the voltage UA at point A will be 0 V and the voltage drop across diode D2 will also be 0 V.

The effects of the parasitic capacitances of photodiode DPH are eliminated by means of a capacitor C1 (100 nF) connected between the anode of photodiode DPH and the point B. Thus, the circuit of FIG. 6 possesses good limiting properties and a small signal bandwidth of 100 MHz.

Figure 7:
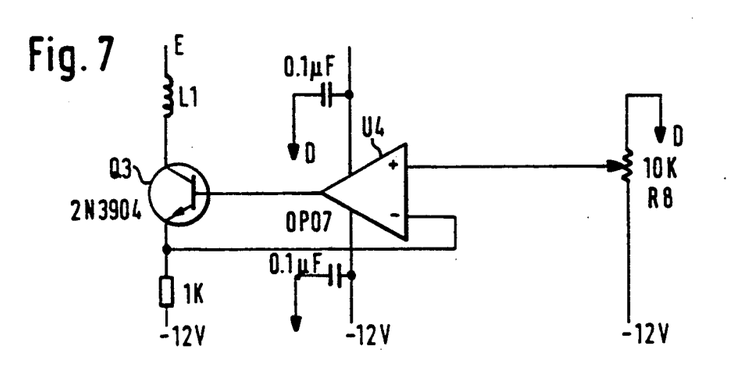
FIG. 7 is a schematic diagram representing a constant current circuit usable in the circuit of FIG. 6.

The current source $I_Q$ may be realized in some instances by a resistor; however, the circuit of FIG. 7 may be used in all cases. In the circuit of FIG. 7, an NPN transistor Q3 and an operational amplifier U4 are connected as shown. E represents the output terminal of the constant current source and is to be connected to point B of FIG. 6. A bead at the collector of transistor Q3 provides an inductor L1 that prevents oscillations. R8 is a 10 K potentiometer for setting the output current. In the example, Q3 is of the type 2N3904 and U4 is of the type OP07.

In the embodiment of FIG. 6, the photodiode DPH has a metallic housing which is connected with the point B in order to reduce the influence of parasitic capacitances. In addition, transistor Q1 is of the type MGF 1302, transistor Q2 is of the type BFR 96, diodes D2 and D3 are Schottky diodes of the type HP 2811 and photodiode DPH has a responsivity of 15 A/W at about 1300 nm and is provided with a voltage $-U_D$ of about 80 V, which is much smaller than voltage UI. The gain of the amplifier U1 is determined by resistors R5 and R4 and is about 2.34. The gains of the other amplifiers are +1 each. The maximum input voltage at the point A is $-0.8$ V, and the maximum output voltage at point C is 1.872 V.

The Schottky diodes are connected in the flow direction in order to use their threshold of 0.4 V. It is also possible to use, e.g., Zener diodes and connect them in reverse.

Figure 8:
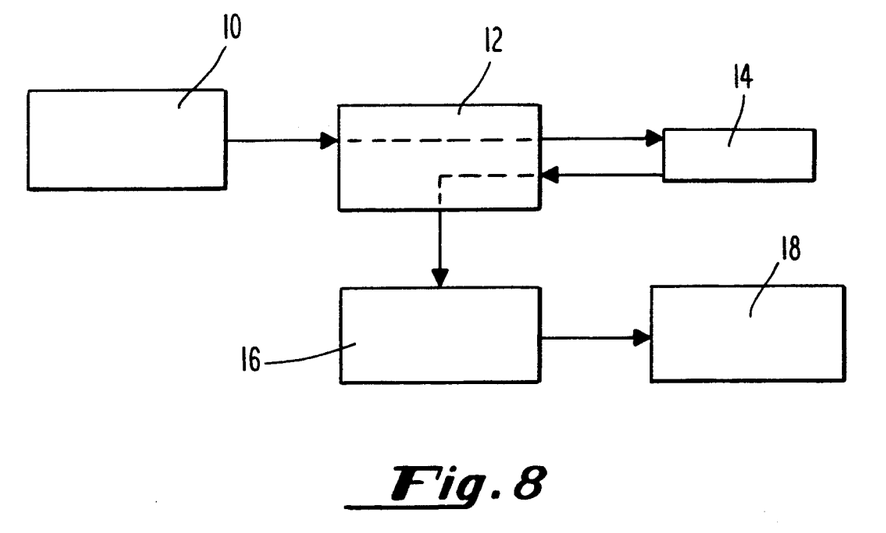
FIG. 8 is a block diagram of an OTDR in accordance with the present invention.

FIG. 8 depicts the basic components of an OTDR for testing an optical fiber or waveguide. These components include a source 10 (e.g., a laser diode) for producing an optical test signal, an optical system 12 for coupling the optical signal to a fiber or waveguide under test 14, optical receiving means 16 for receiving optical signals reflected from the fiber or waveguide under test 14 and converting the received optical signals into voltage signals, and a digital processor 18 for analyzing the received signals. In a preferred embodiment of the invention, the optical receiving means 16 comprises a current-voltage converter in accordance with the above-described embodiments.

Although preferred embodiments of the invention are described above, it is noted that many modifications and variations of the circuitry described will be apparent to one who is skilled in the art. Accordingly, the scope of the invention is to be limited only by the following claims.

What is claimed is:

1. A current-voltage converter having an input port and an output port, comprising:
    amplifying means, coupled between said input port and said output port, for converting an input voltage UI appearing at said input port into an output voltage UO, comprising:
        an inverting amplifier having an output terminal coupled to said output port;
        a feedback resistance means coupled between said output port and said input port; and
        a first noninverting amplifier coupled between said input port and an input terminal of said inverting amplifier; and
    voltage clipping means, coupled to said input port, for limiting the maximum value of input voltage UI appearing at said input port, whereby the maximum output voltage UO is the product of the gain of said amplifying means and a maximum input voltage $UI_{max}$, as limited by said voltage clipping means.

2. A current-voltage converter as recited in claim 1, further comprising:
    photodiode means, coupled between said input port and a fixed voltage point, for providing a current ($I_i$) at said input port in response to an optical signal.

3. A current-voltage converter as recited in claim 1, further comprising:
    a second noninverting amplifier having an input terminal coupled to the output terminal of the first noninverting amplifier and an output terminal coupled to said voltage clipping means; and
    means for setting the gains of said first and second noninverting amplifiers such that the product of said gains is approximately +1.

4. A current-voltage converter as recited in claim 3, wherein the gain of each of the first and second noninverting amplifiers is set to approximately +1.

5. A current-voltage converter as recited in claim 3, further comprising:
    second voltage clipping means coupled to the output terminal of said second noninverting amplifier, for limiting the output voltage appearing at the output terminal of said second noninverting amplifier.

6. A current-voltage converter as recited in claim 3, wherein said second noninverting amplifier comprises a transistor having a base defining its input terminal, an emitter defining its output terminal, and a resistor coupled between the emitter and a fixed potential.

7. A current-voltage converter as recited in claim 1, wherein said first noninverting amplifier comprises an FET having a gate for its input and a source for its output.

8. A current-voltage converter as recited in claim 7, further comprising:
    current source means, coupled to said source of said FET, for adjusting the DC voltage between said gate and said source.

9. An optical time domain reflectometer (OTDR) for testing an optical fiber or waveguide, comprising:
    source means for providing an optical signal to said fiber or guide;
    receiving means for receiving said signal after transmission of said signal through said fiber or guide, comprising:
        a current-voltage converter having an input port and an output port, and comprising:
            amplifying means, coupled between said input port and said output port, for converting an input voltage UI appearing at said input port into an output voltage UO, said amplifying means comprising an inverting amplifier having an output terminal coupled to said output port, a feedback resistor coupled between said output port and said input port, and a first noninverting amplifier coupled between said input port and an input terminal of said inverting amplifier;
            voltage clipping means, coupled to the input port, for limiting the maximum value of input voltage UI appearing at said input port; and
            photodiode means, coupled between said input port and a fixed voltage point, for providing a current ($I_i$) at said input port in response to an optical signal; and
    coupling means for coupling said optical signal provided by said source means to said optical fiber or waveguide, and for coupling signals reflected by said optical fiber or waveguide to said receiving means.

10. An OTDR as recited in claim 9, further comprising:
    a second noninverting amplifier having an input terminal coupled to the output terminal of the first noninverting amplifier and an output terminal coupled to said voltage clipping means; and
    means for setting the gains of said first and second noninverting amplifiers such that the product of said gains is approximately +1.

11. An OTDR as recited in claim 10, wherein the gain of each of the first and second noninverting amplifiers is set to approximately +1.

12. An OTDR as recited in claim 10, further comprising:
    second voltage clipping means coupled to the output terminal of said second noninverting amplifier, for limiting the output voltage appearing at the output terminal of said second noninverting amplifier.

13. An OTDR as recited in claim 10, wherein said second noninverting amplifier comprises a transistor having a base defining its input terminal, an emitter defining its output terminal, and a resistor coupled between the emitter and a fixed potential.

14. An OTDR as recited in claim 9, wherein said first noninverting amplifier comprises an FET having a gate for its input terminal and a source for its output terminal.

15. An OTDR as recited in claim 14, further comprising:
    current source means, coupled to said source terminal of said FET, for adjusting the DC voltage between the gate and source.

* * * * *